United States Patent
Lin et al.

(10) Patent No.: US 11,257,555 B2
(45) Date of Patent: Feb. 22, 2022

(54) WEAR LEVELING IN EEPROM EMULATOR FORMED OF FLASH MEMORY CELLS

(71) Applicant: Silicon Storage Technology, Inc., San Jose, CA (US)

(72) Inventors: Guangming Lin, Shanghai (CN); Xiaozhou Qian, Shanghai (CN); Xiao Yan Pi, Shanghai (CN); Vipin Tiwari, Dublin, CA (US); Zhenlin Ding, Shanghai (CN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/006,550

(22) Filed: Aug. 28, 2020

(65) Prior Publication Data
US 2021/0264996 A1    Aug. 26, 2021

(30) Foreign Application Priority Data
Feb. 21, 2020 (CN) .......................... 202010106388.9

(51) Int. Cl.
*G11C 16/04* (2006.01)
*G11C 16/34* (2006.01)
(Continued)

(52) U.S. Cl.
CPC ...... *G11C 16/3495* (2013.01); *G11C 16/0416* (2013.01); *G11C 16/10* (2013.01);
(Continued)

(58) Field of Classification Search
CPC . G11C 16/3495; G11C 16/0416; G11C 16/10; G11C 16/14; G11C 16/26
(Continued)

(56) References Cited

U.S. PATENT DOCUMENTS 5,956,473 A * 9/1999 Ma ....................... G11C 16/349
714/5.1
7,868,375 B2    1/2011 Liu et al.
(Continued)

OTHER PUBLICATIONS

"EEPROM Emulation Using Internal Flash Memory ED—Darl Kuhn," IP.com, IP.com Inc., West Henrietta, NY, US, Jan. 27, 2015, ISSN: 1533-0001, line 11, paragraph 7—line 16; figures 2-1.

*Primary Examiner* — Ly D Pham
(74) *Attorney, Agent, or Firm* — DLA Piper LLP US

(57) ABSTRACT

The present invention relates to systems and methods for implementing wear leveling in a flash memory device that emulates an EEPROM. The embodiments utilize an index array, which stores an index word for each logical address in the emulated EEPROM. Each bit in each index word is associated with a physical address for a physical word in the emulated EEPROM, and the index word keeps track of which physical word is the current word for a particular logical address. The use of the index word enables a wear leveling algorithm that allows for a programming command to a logical address to result in: (i) skipping the programming operation if the data stored in the current word does not contain a "1" that corresponds to a "0" in the data to be stored, (ii) reprogramming one or more bits of the current word in certain situations, or (iii) shifting to and programming the next physical word in certain situations.

8 Claims, 14 Drawing Sheets

(51) Int. Cl.
    *G11C 16/26*         (2006.01)
    *G11C 16/14*         (2006.01)
    *G11C 16/10*         (2006.01)
    *G06F 12/02*         (2006.01)
    *G06F 12/08*         (2016.01)

(52) U.S. Cl.
    CPC .............. *G11C 16/14* (2013.01); *G11C 16/26* (2013.01); *G06F 12/0246* (2013.01); *G06F 2212/7211* (2013.01)

(58) Field of Classification Search
    USPC .................................................... 365/185.09
    See application file for complete search history.

(56) References Cited

U.S. PATENT DOCUMENTS

| | | | |
|---|---|---|---|
| 8,130,554 B1 * | 3/2012 | Linnell | G11C 16/14 365/185.28 |
| 9,286,982 B2 | 3/2016 | Tran et al. | |
| 10,877,900 B1 * | 12/2020 | Muthiah | G06F 9/44505 |
| 2007/0136509 A1 * | 6/2007 | Agami | G06F 3/0643 711/103 |
| 2010/0293320 A1 * | 11/2010 | Li | G06F 12/0246 711/103 |
| 2013/0019057 A1 * | 1/2013 | Stephens | G06F 3/0638 711/103 |
| 2013/0191601 A1 * | 7/2013 | Peterson | G06F 12/0868 711/137 |
| 2019/0332331 A1 * | 10/2019 | Hsieh | G06F 12/0246 |
| 2019/0392903 A1 | 12/2019 | Miyazaki | |

* cited by examiner

FIGURE 9

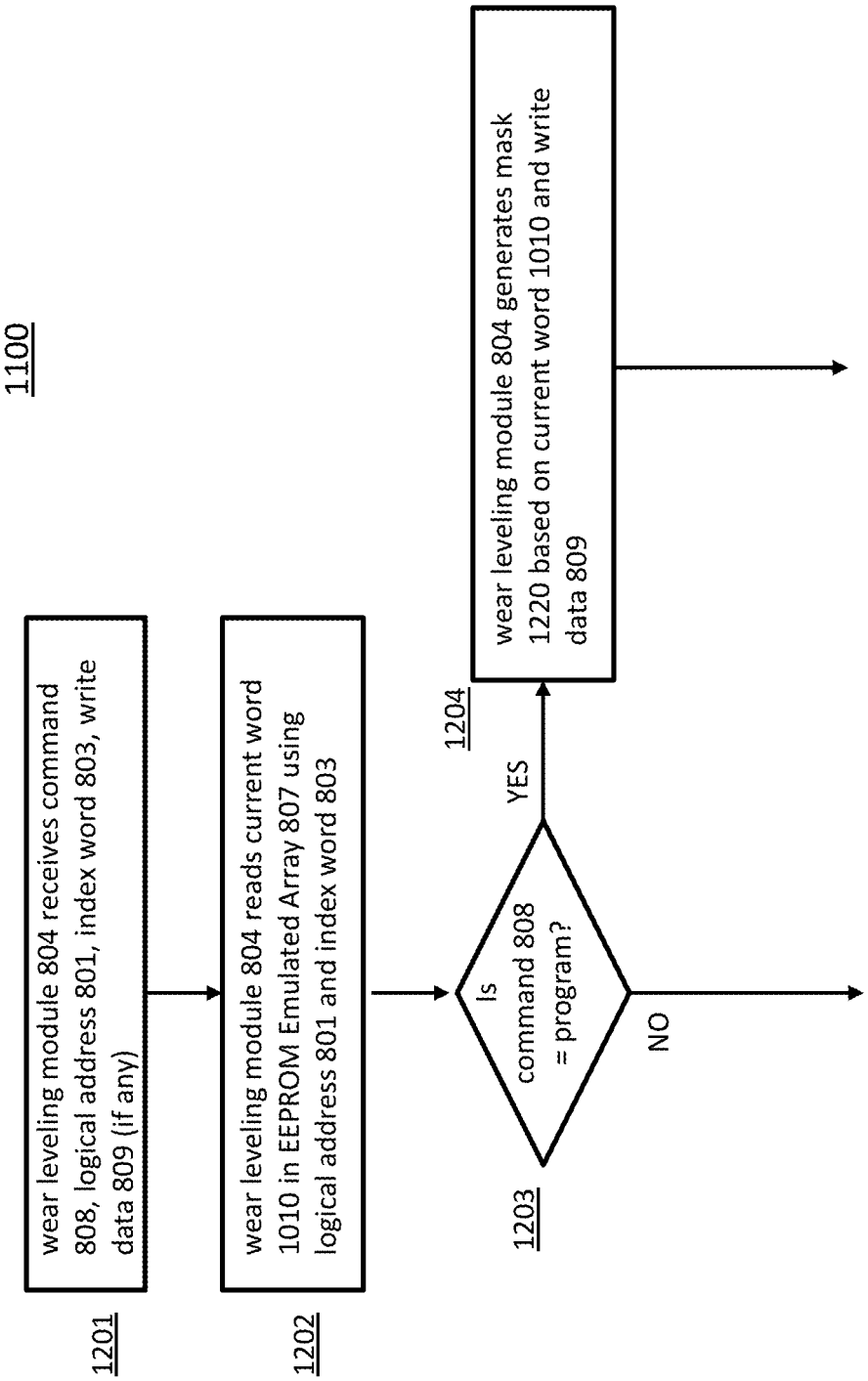

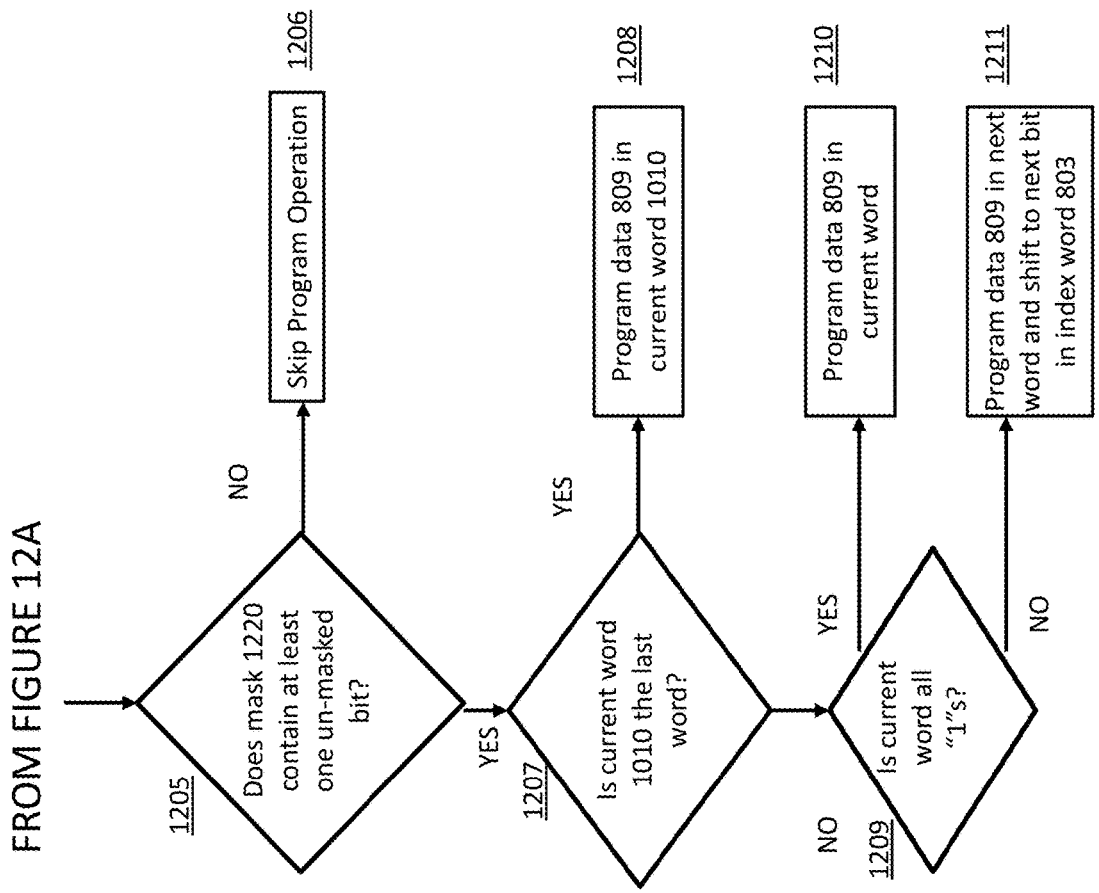

WEAR LEVELING IN EEPROM EMULATOR FORMED OF FLASH MEMORY CELLS

PRIORITY CLAIM

This application claims priority to Chinese Patent Application No. 202010106388.9, filed on Feb. 21, 2020, and titled "Wear Leveling In EEPROM Emulator Formed Of Flash Memory Cells."

TECHNICAL FIELD

The present invention relates to systems and methods for implementing wear leveling in an electrically erasable programmable read only memory (EEPROM) emulator formed of flash memory cells.

BACKGROUND OF THE INVENTION

Non-volatile memory cells are well known in the art. A first type of prior art non-volatile memory cell 110 is shown in FIG. 1. The memory cell 110 comprises a semiconductor substrate 112 of a first conductivity type, such as P type. The substrate 112 has a surface on which there is formed a first region 114 (also known as the source line SL terminal) of a second conductivity type, such as N type, and which is typically connected to a source line (not shown). A second region 116 (also known as the drain line) also of N type is formed on the surface of the substrate 112. Between the first region 114 and the second region 116 is a channel region 118. A bit line BL terminal 120 is connected to the second region 116 and typically is connected to a bit line (not shown). A word line WL terminal 122 is positioned above a first portion of the channel region 118 and is insulated therefrom and typically is connected to a word line (not shown). The word line terminal 122 has little or no overlap with the second region 116. A floating gate FG 124 is over another portion of the channel region 118. The floating gate 124 is insulated therefrom, and is adjacent to, and insulated from, the word line terminal 122. The floating gate 124 is also adjacent to the first region 114. The floating gate 124 may overlap the first region 114 significantly to provide strong coupling from the first region 114 into the floating gate 124.

One exemplary operation for erase and program of prior art non-volatile memory cell 110 is as follows. The non-volatile memory cell 110 is erased, through a Fowler-Nordheim tunneling mechanism, by applying a high voltage on the word line terminal 122 and zero volts to the bit line terminal 120 and source line terminal 114. Electrons tunnel from the floating gate 124 into the word line terminal 122 causing the floating gate 124 to be positively charged, turning on the non-volatile memory cell 110 in a read condition. The resulting cell erased state is known as '1' state. The cell 110 is programmed, through a source side hot electron programming mechanism, by applying a high voltage on the source line 114, a small voltage on the word line terminal 122, and a programming current on the bit line terminal 120. A portion of electrons flowing across the gap between the word line terminal 122 and the floating gate 124 acquire enough energy to inject into the floating gate 124 causing the floating gate 124 to be negatively charged, turning off the non-volatile memory cell 110 in read condition. The resulting non-volatile memory cell programmed state is known as '0' state.

Exemplary voltages that can be used for the read, program, erase, and standby operations in memory cell 110 is shown below in Table 1:

TABLE 1

| Operation | WL | BL | SL |
|---|---|---|---|
| Read | Vwlrd | Vblrd | 0 V |
| Program | Vwlp | Iprog/Vinh (unsel) | Vslp |
| Erase | Vwler | 0 V | 0 V |
| Standby | 0 V | 0 V | 0 V |

Vwlrd ~2-3 V
Vblrd ~0.8-2 V
Vwlp ~1-2 V
Vwler ~11-13 V
Vslp ~9-10 V
Iprog ~1-3 ua
Vinh ~2 V A second type of prior art non-volatile memory cell 210 is shown in FIG. 2. The non-volatile memory cell 210 comprises a semiconductor substrate 212 of a first conductivity type, such as P type. The substrate 212 has a surface on which there is formed a first region 214 (also known as the source line SL terminal) of a second conductivity type, such as N type, and which is typically connected to a source line (not shown). A second region 216 (also known as the drain line) also of N type is formed on the surface of the substrate 212. Between the first region 214 and the second region 216 is a channel region 218. A bit line BL terminal 220 is connected to the second region 216 and is typically connected to a bit line (not shown). A word line WL terminal 222 is positioned above a first portion of the channel region 218 and is insulated therefrom, and is typically connected to a word line (not shown). The word line terminal 222 has little or no overlap with the second region 216. A floating gate FG 224 is over another portion of the channel region 218. The floating gate 224 is insulated therefrom, and is adjacent to, and insulated from, the word line terminal 222. The floating gate 224 is also adjacent to the first region 214. The floating gate 224 may overlap the first region 214 to provide coupling from the first region 214 into the floating gate 224. A coupling gate CG terminal (also known as control gate terminal) 226 is over the floating gate 224 and is insulated therefrom, and is also insulated from the word line terminal 222, and is typically connected to a coupling gate or control gate (not shown).

One exemplary operation for erase and program of prior art non-volatile memory cell 210 is as follows. The non-volatile memory cell 210 is erased, through a Fowler-Nordheim tunneling mechanism, by applying a high voltage on the word line terminal 222 with other terminals equal to zero volts. Electrons tunnel from the floating gate 224 into the word line terminal 222 to be positively charged, turning on the cell 210 in a read condition. The resulting non-volatile memory cell erased state is known as '1' state. The non-volatile memory cell 210 is programmed, through a source side hot electron programming mechanism, by applying a high voltage on the coupling gate terminal 226, a high voltage on the source line terminal 214, and a programming current on the bit line terminal 220. A portion of electrons flowing across the gap between the word line terminal 222 and the floating gate 224 acquire enough energy to inject into the floating gate 224 causing the floating gate 224 to be negatively charged, turning off the non-volatile memory cell 210 in read condition. The resulting non-volatile memory cell programmed state is known as '0' state.

Exemplary voltages that can be used for the read, program, erase, and standby operations in memory cell 210 is shown below in Table 2:

TABLE 2

| Operation | WL | WL-unselect | BL | BL-unselect | CG | CG-unselect same sector | CG-unselect | SL | SL-unselect |
|---|---|---|---|---|---|---|---|---|---|
| Read | 1.0-3 V | 0 V | 0.6-2 V | 0 V | 0-2.6 V | 0-2.6 V | 0-2.6 V | 0 V | 0 V |
| Erase | 11-10 V | 0 V | 0 V | 0 V | 0 V | 0 V | 0 V | 0 V | 0 V |
| Program | 1 V | 0 V | 1 uA | Vinh | 8-11 V | 0-2.6 V | 0-2.6 V | 4.5-5 V | 0-1 V |

Another set of exemplary voltages (when a negative voltage is available for read and program operations) that can be used for the read, program, and erase operations in non-volatile memory cell 210 is shown below in Table 3:

TABLE 3

| Operation | WL | WL-unselect | BL | BL-unselect | CG | CG-unselect same sector | CG-unselect | SL | SL-unselect |
|---|---|---|---|---|---|---|---|---|---|
| Read | 1.0-2 V | −0.5 V/0 V | 0.6-2 V | 0 V | 0-2.6 V | 0-2.6 V | 0-2.6 V | 0 V | 0 V |
| Erase | 11-10 V | 0 V | 0 V | 0 V | 0 V | 0 V | 0 V | 0 V | 0 V |
| Program | 1 V | −0.5 V/0 V | 1 uA | Vinh | 8-11 V | 0-2.6 V | 0-2.6 V | 4.5-5 V | 0-1 V |

Another set of exemplary voltages (when a negative voltage is available for read, program, and erase operations) that can be used for the read, program, and erase operations in non-volatile memory cell 210 is shown below in Table 4:

TABLE 4

| Operation | WL | WL-unselect | BL | BL-unselect | CG | CG-unselect same sector | CG-unselect | SL | SL-unselect |
|---|---|---|---|---|---|---|---|---|---|
| Read | 1.0-2 V | −0.5 V/0 V | 0.6-2 V | 0 V | 0-2.6 V | 0-2.6 V | 0-2.6 V | 0 V | 0 V |
| Erase | 9-6 V | −0.5 V/0 V | 0 V | 0 V | −(5-9) V | 0 V | 0 V | 0 V | 0 V |
| Program | 1 V | −0.5 V/0 V | 1 uA | Vinh | 8-9 V | 0-2.6 V | 0-2.6 V | 4.5-5 V | 0-1 V |

A third type of non-volatile memory cell 310 is shown in FIG. 3. The non-volatile memory cell 310 comprises a semiconductor substrate 312 of a first conductivity type, such as P type. The substrate 312 has a surface on which there is formed a first region 314 (also known as the source line SL terminal) of a second conductivity type, such as N type, which is typically connected to a source line (not shown). A second region 316 (also known as the drain line) also of N type is formed on the surface of the substrate 312. Between the first region 314 and the second region 316 is a channel region 318. A bit line BL terminal 320 is connected to the second region 316 and is typically connected to a bit line (not shown). A word line WL terminal 322 is positioned above a first portion of the channel region 318 and is insulated therefrom, and is typically connected to a word line (not shown). The word line terminal 322 has little or no overlap with the second region 316. A floating gate FG 324 is over another portion of the channel region 318. The floating gate 324 is insulated therefrom, and is adjacent to, and insulated from, the word line terminal 322. The floating gate 324 is also adjacent to the first region 314. The floating gate 324 may overlap the first region 314 to provide coupling from the first region 314 into the floating gate 324. A coupling gate CG terminal (also known as control gate terminal) 326 is over the floating gate 324 and is insulated therefrom and is typically connected to a coupling gate line or control gate line (not shown). An erase gate EG terminal 328 is over the first region 314 and is adjacent to the floating gate 324 and the coupling gate terminal 326 and is insulated therefrom, and is typically connected to an erase gate line (not shown). The top corner of the floating gate 324 may point toward the inside corner of the T-shaped erase gate 328 to enhance erase efficiency. The erase gate 328 is also insulated from the first region 314. The non-volatile memory cell 310 is more particularly described in U.S. Pat. No. 7,868,375, which is incorporated herein by reference in its entirety.

One exemplary operation for erase and program of prior art non-volatile memory cell 310 is as follows. The non-volatile memory cell 310 is erased, through a Fowler-Nordheim tunneling mechanism, by applying a high voltage on the erase gate terminal 328 with other terminals equal to zero volt. Electrons tunnel from the floating gate 324 into the erase gate terminal 328 causing the floating gate 324 to be positively charged, turning on the non-volatile memory cell 310 in a read condition. The resulting non-volatile memory cell erased state is known as '1' state. The non-volatile memory cell 310 is programmed, through a source side hot electron programming mechanism, by applying a high voltage on the coupling gate terminal 326, a high voltage on the source line terminal 314, a medium voltage on the erase gate terminal 328, and a programming current on the bit line terminal 320. A portion of electrons flowing across the gap between the word line terminal 322 and the floating gate 324 acquire enough energy to inject into the floating gate 324 causing the floating gate 324 to be negatively charged, turning off the non-volatile memory cell 310 in read condition. The resulting non-volatile memory cell programmed state is known as '0' state.

Exemplary voltages that can be used for the read, program, and erase operations in non-volatile memory cell 310 is shown below in Table 5:

TABLE 5

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | 0 V | 0.6-2 V | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0 V | 0 V | 11.5-12 V | 0-2.6 V | 0 V | 0 V |
| Program | 1 V | 0 V | 1 uA | Vinh | 10-11 V | 0-5 V | 0-2.6 V | 4.5-8 V | 0-2.6 V | 4.5-5 V | 0-1 V |

For programming operation, the EG voltage can be applied much higher, e.g. 8V, than the SL voltage, e.g., 5V, to enhance the programming operation. In this case, the unselected CG program voltage is applied at a higher voltage (CG inhibit voltage), e.g. 6V, to reduce unwanted erase effect of the adjacent memory cells sharing the same EG gate 328 of the selected non-volatile memory cells.

Another set of exemplary voltages (when a negative voltage is available for read and program operations) that can be used for the read, program, and erase operations in non-volatile memory cell 310 is shown below in Table 6:

TABLE 6

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0 V | 0 V | 11.5-12 V | 0-2.6 V | 0 V | 0 V |
| Program | 1 V | −0.5 V/0 V | 1 uA | Vinh | 10-11 V | 0-2.6 V | 0-2.6 V | 4.5-5 V | 0-2.6 V | 4.5-5 V | 0-1 V |

Another set of exemplary voltages (when a negative voltage is available for read, program, and erase operations) that can be used for the read, program, and erase operations in non-volatile memory cell 310 is shown below in Table 7:

TABLE 7

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V | 0 V | 0-2.6 V | 0-2.6 V | 0-2.6 V | 0-2.6 V | 0-2.6 V | 0 V | 0 V |
| Erase | 0 V | −0.5 V/0 V | 0 V | 0 V | −(5-9) V | 0 V | 0 V | 9-8 V | 0-2.6 V | 0 V | 0 V |
| Program | 1 V | −0.5 V/0 V | 1 uA | Vinh | 8-9 V | 0-5 V | 0-2.6 V | 8-9 V | 0-2.6 V | 4.5-5 V | 0-1 V |

For programming operation, the EG voltage is applied much higher, e.g. 8-9V, than the SL voltage, e.g., 5V, to enhance the programming operation. In this case, the unselected CG program voltage is applied at a higher voltage (CG inhibit voltage), e.g. 5V, to reduce unwanted erase effects of the adjacent memory cells sharing the same EG gate 328 of the selected non-volatile memory cells 310.

Non-volatile memory cells of the types shown in FIGS. 1-3 often are referred to as flash memory cells. Flash memory cells typically are arranged into rows and columns to form an array. Erase operations are performed on entire rows or pairs of rows at one time, since word lines control entire rows of memory cells and erase gates (of the type shown in FIG. 3), when present, are shared by pairs of rows of memory cells. Thus, in prior art memory systems using memory cells of the types shown in FIGS. 1-3, it has not been possible to erase only one byte of data or one byte pair of data at a time.

Also known in the prior art are EEPROM devices. As with the flash memory cells of FIGS. 1-3, EEPROM devices are non-volatile memory devices. However, in an EEPROM device, cells can be erased one byte at a time, unlike in the systems utilizing the memory cells of FIGS. 1-3. EEPROM cell size is typically much larger than flash memory cell size.

Applicant previously disclosed a flash memory device that can emulate an EEPROM device and can be erased on a byte-by-byte basis, in U.S. patent application Ser. No. 14/455,698, filed on Aug. 8, 2014, titled, "Flash Memory System With EEPROM Functionality," and issued as U.S. Pat. No. 9,286,982, which is incorporated herein by reference.

FIGS. 4-6 depict one embodiment of a flash memory system that can be used as an EEPROM emulator in the prior art, consistent with the disclosure of U.S. patent application Ser. No. 14/455,698.

FIG. 4 depicts exemplary word 400, which comprises bytes 401 and 402. Byte 401 comprises non-volatile memory cells 403-0, 403-1, and 403-7. Byte 402 comprises non-volatile memory cells 403-8, 403-9, and 403-15. Thus, each non-volatile memory cell typically stores 1 bit (i.e., a "0" or "1"). 8 bits form a byte, and 2 bytes form a word.

FIG. 5 depicts exemplary sector 500, which comprises words 400-0, 400-1, and 400-15. Thus, each sector comprises two adjacent rows of words. In this example, each row comprises 8 words. The two adjacent rows of words typically have separate word lines but a shared source line and/or erase gate line.

FIG. 6 depicts exemplary array 610, which comprises sectors 500-0, 500-1, and 500-i, where array 610 comprises i+1 sectors. Decoder 600 receives logical address 601, typically from a source external to the non-volatile memory system. Decoder 600 outputs control signals 602 for physical address 603. Physical address 603 is a unique address for a physical location in the memory array, usually comprising a column number and row number. Control signals 602 assert the row and column for physical address 603. Decoder 600 can comprise logic circuitry and/or a controller or processor executing software.

Flash memory systems that emulate EEPROM devices are at risk for uneven wear. Specifically, programming and erase operations cause stress to the physical devices, and over time, the device will become unusable. This is particularly true if the same portions of the physical device are used over and over. In addition, such devices are susceptible to a phenomena called "program disturb." Program disturb occurs when a non-volatile memory cell is programmed several times before being erased. In such a situation, non-volatile memory cells adjacent to that non-volatile memory cell might become inadvertently programmed due to the voltages applied to the cell during the programming operations. This will have the undesirable effect of programming an adjacent non-volatile memory cell when the system did not intend to do so.

These problems can be at least partially mitigated by implementing a wear leveling technique. FIG. 7 depicts a prior art wear leveling method 700 that can be implemented by decoder 600 or by logic external to decoder 600. In this example, sector 500 is used as EEPROM word 710, which is a unit where the EEPROM emulator stores a single word of data (typically, two bytes). Because sector 500 comprises 16 physical words (400-0, 400-15), this means that a single EEPROM word 710 corresponds to 16 physical locations where it can be stored, i.e., EEPROM word 710 may be stored in any of 16 physical locations.

In prior art wear leveling method 700, when EEPROM word 710 is first programmed, its data is written to word 400-0. When EEPROM word 710 is updated, rather than erasing word 400-0 and programming word 400-0 with the updated data, the updated data is instead written to word 400-1. At this point, the data stored in word 400-0 is stale. Each subsequent programming operation of EEPROM word 710 uses the next word 400 in sector 500, until for the 16th programming operation, word 400-15 is programmed. At this point, each word in section 500 has been programmed once since the last erase operation. When yet another programming operation is commanded for EEPROM word 710, the system will perform a sector erase and erase sector 500, and then program the data into word 400-0, thus starting the process over. One of ordinary skill in the art will appreciate that prior art wear leveling method 700 spreads the "wear" out among all portions of sector 500 instead of concentrating the wear in specific locations.

Although prior art wear leveling method 700 is beneficial, it also is somewhat limiting. Specifically, it is a coarse approach to wear leveling, since EEPROM emulators constructed from flash memory devices are capable of bit-level programming (and not just byte-level or word-level programming).

What is needed is an improved system and method for implementing wear leveling in a flash memory system that emulates an EEPROM device in a manner that fully utilizes the functionality of the device, including the ability to perform bit-level programming, and that counteracts the program disturb phenomena.

SUMMARY OF THE INVENTION

The present invention relates to systems and methods for implementing wear leveling in a flash memory device that emulates an EEPROM. The embodiments utilize an index array, which stores an index word for each logical address in the emulated EEPROM. Each bit in each index word is associated with a physical address for a physical word in the emulated EEPROM, and the index word keeps track of which physical word is the current word for a particular logical address. The use of the index word enables a wear leveling algorithm that allows for a programming command to a logical address to result in: (i) skipping the programming operation if the data stored in the current word does not contain a "1" that corresponds to a "0" in the data to be stored, (ii) reprogramming one or more bits of the current word in certain situations, or (iii) shifting to and programming the next physical word in certain situations.

BRIEF DESCRIPTION OF THE DRAWINGS

FIG. 9 depicts an exemplary index word in the wear leveling system of FIG. 8.

FIGS. 12A, 12B, and 12C depict additional detail of the wear leveling method of FIG. 11.

DETAILED DESCRIPTION OF THE PREFERRED EMBODIMENT

Figure 1:
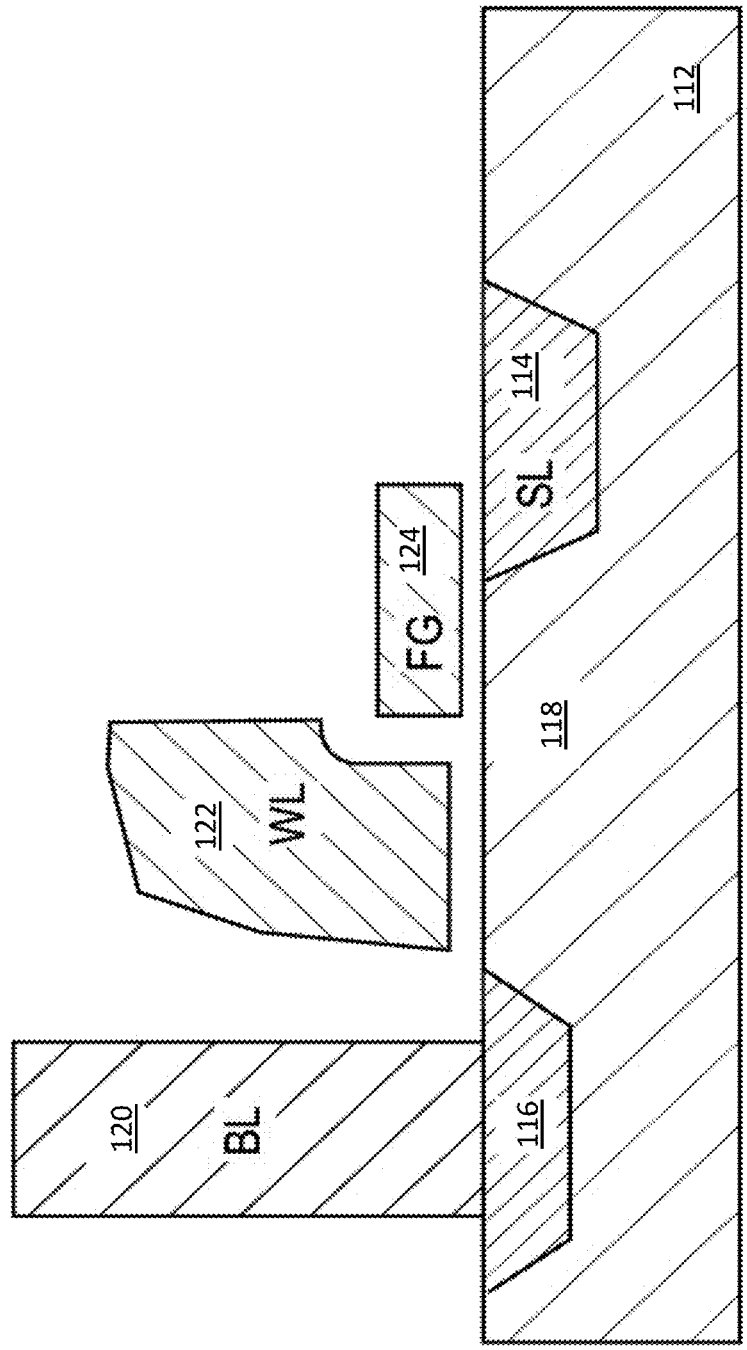
FIG. 1 is a cross-sectional view of a non-volatile memory cell of the prior art to which the method of the present invention can be applied.
Figure 2:
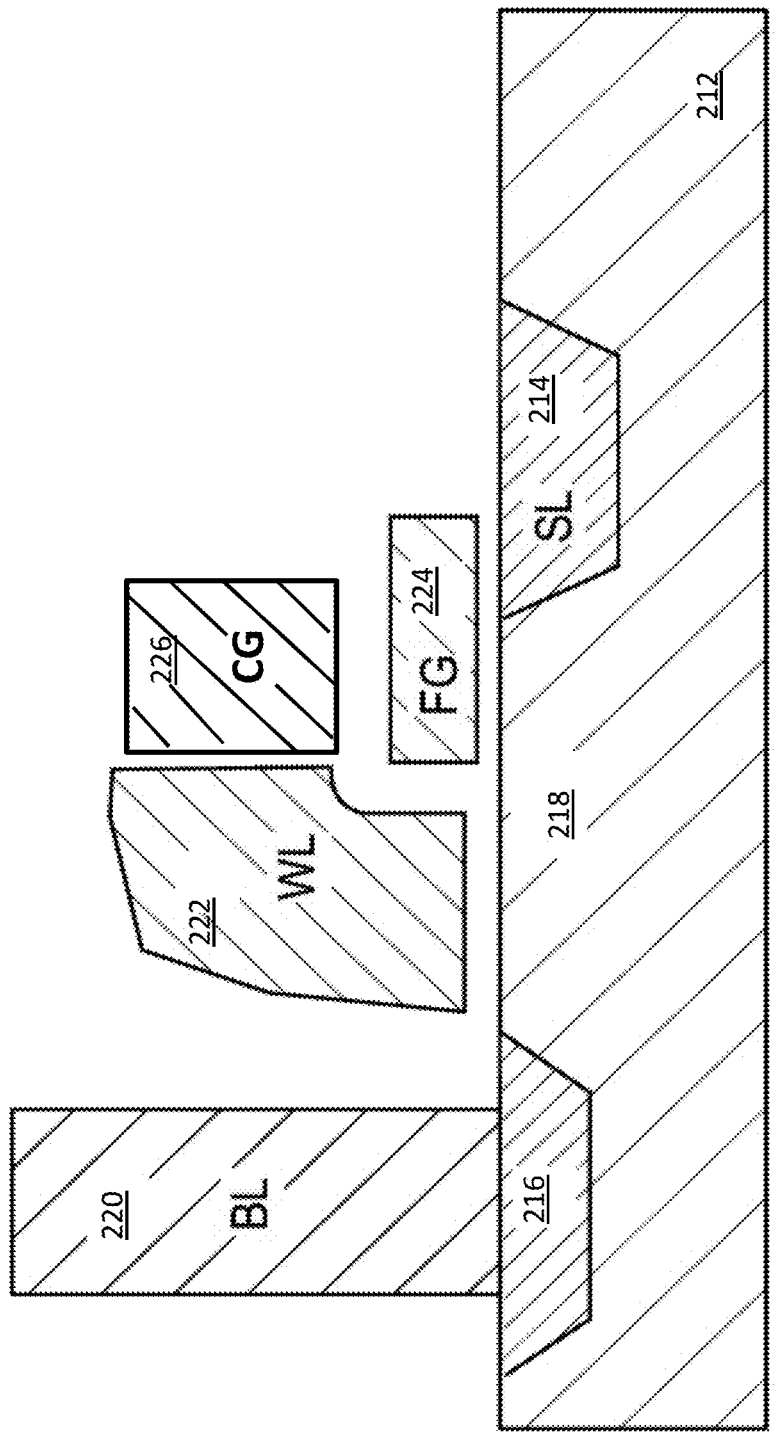
FIG. 2 is a cross-sectional view of a non-volatile memory cell of the prior art to which the method of the present invention can be applied.
Figure 3:
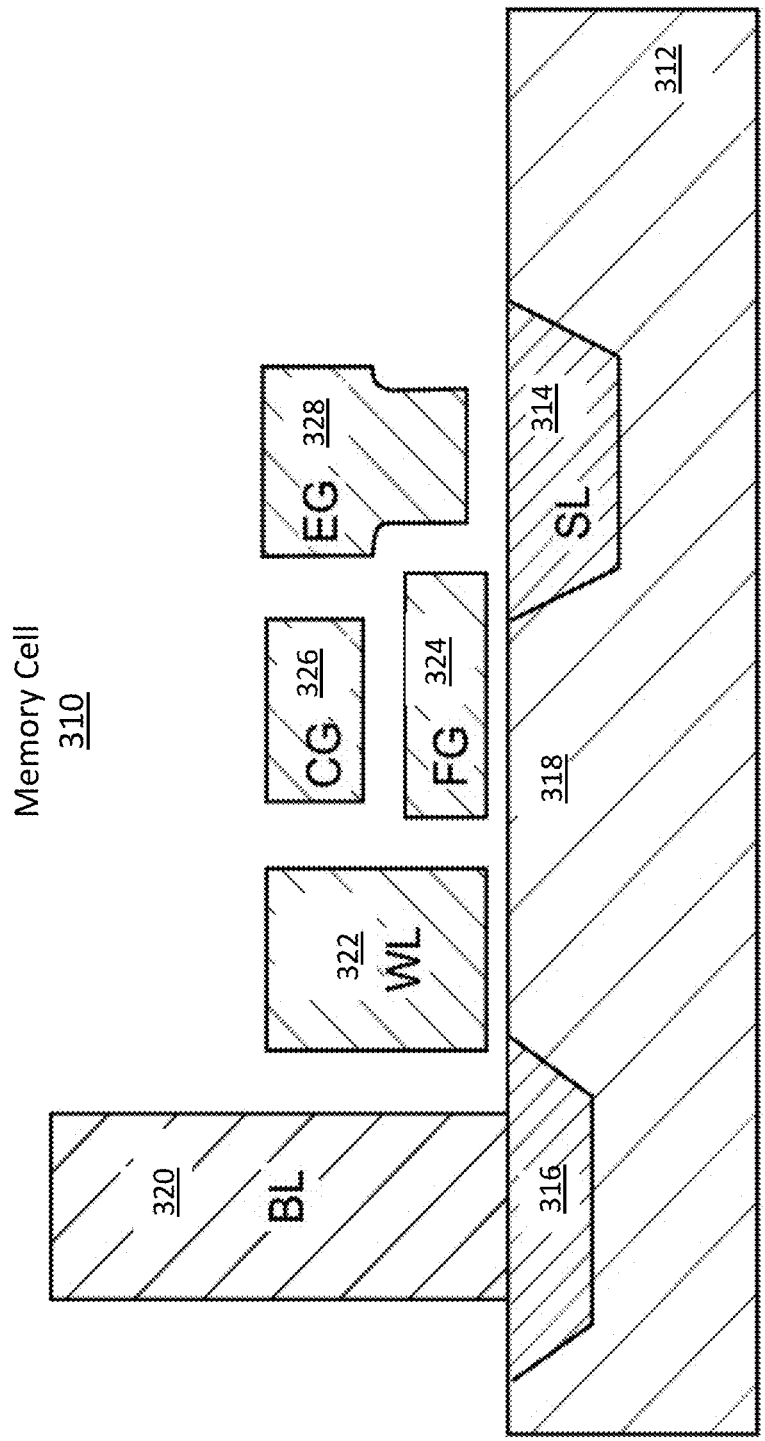
FIG. 3 is a cross-sectional view of a non-volatile memory cell of the prior art to which the method of the present invention can be applied.
Figure 4:
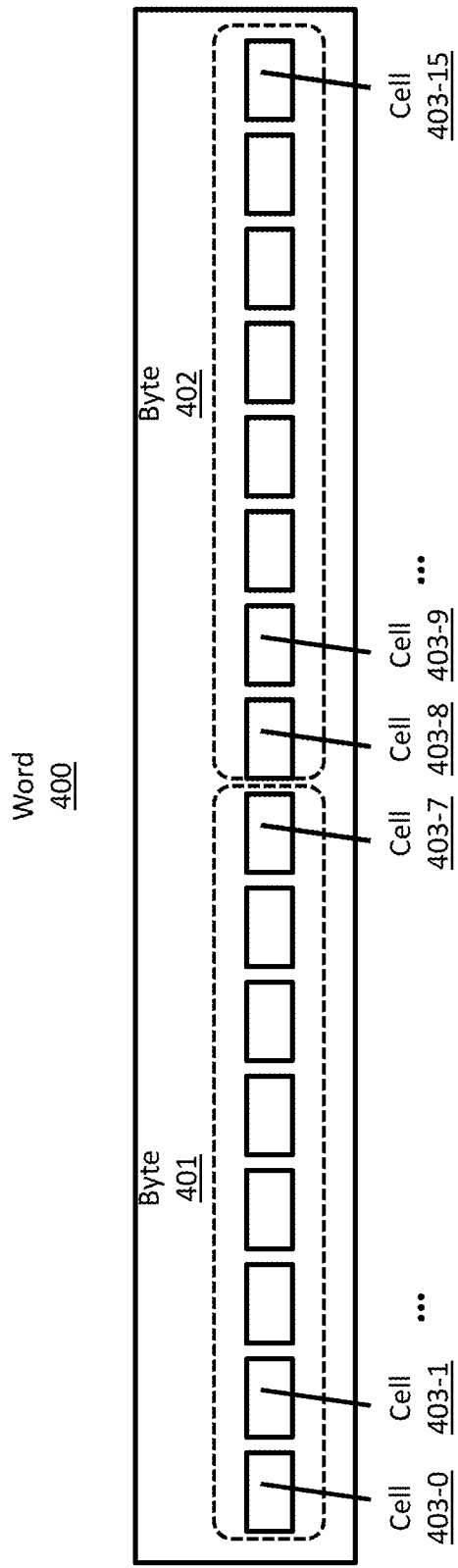
FIG. 4 depicts non-volatile memory cells forming a word.
Figure 5:
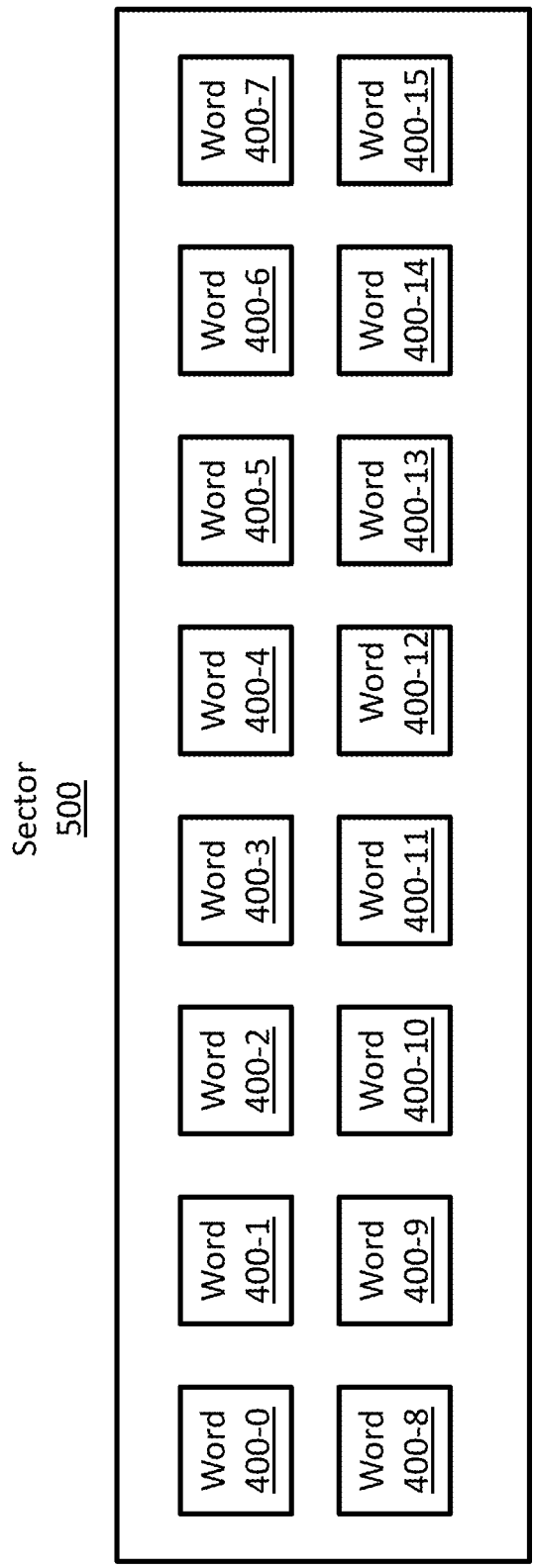
FIG. 5 depicts words of non-volatile memory cells forming a sector.
Figure 6:
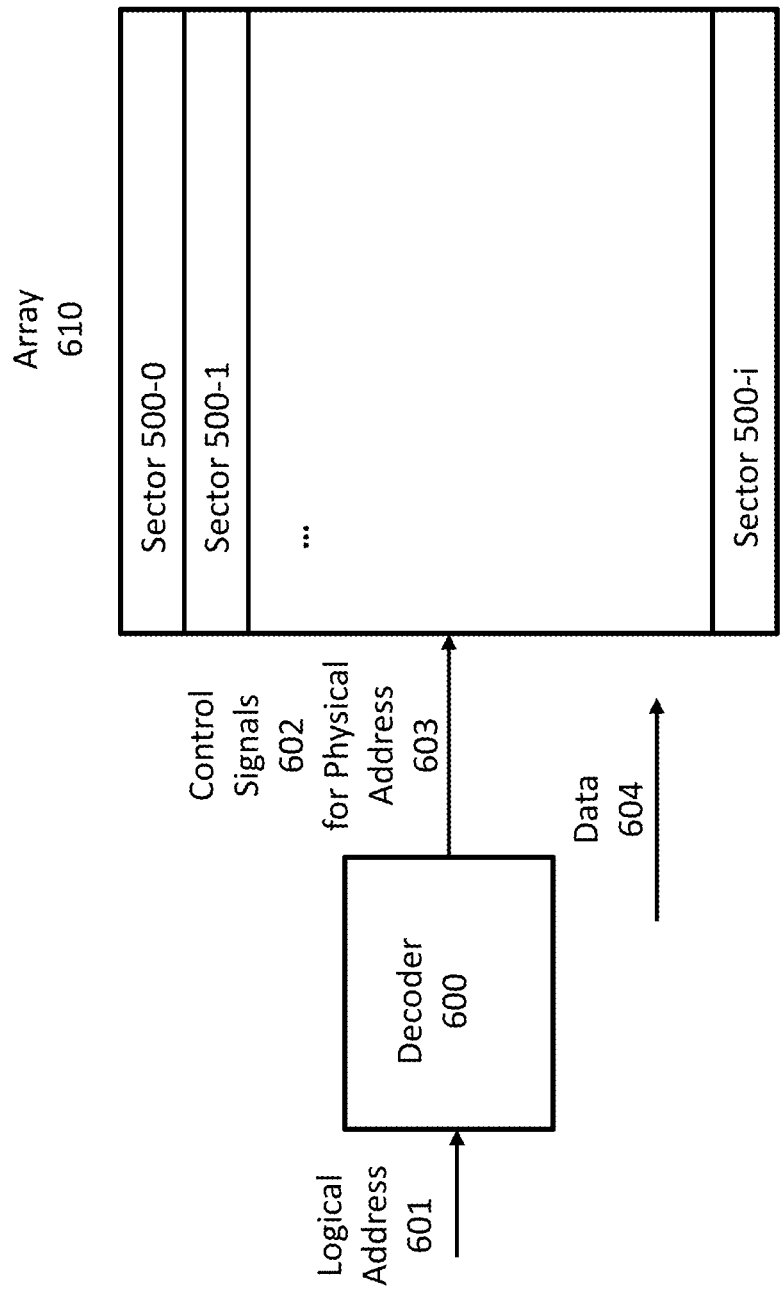
FIG. 6 depicts sectors of non-volatile memory cells forming an array, along with a decoder.
Figure 7:
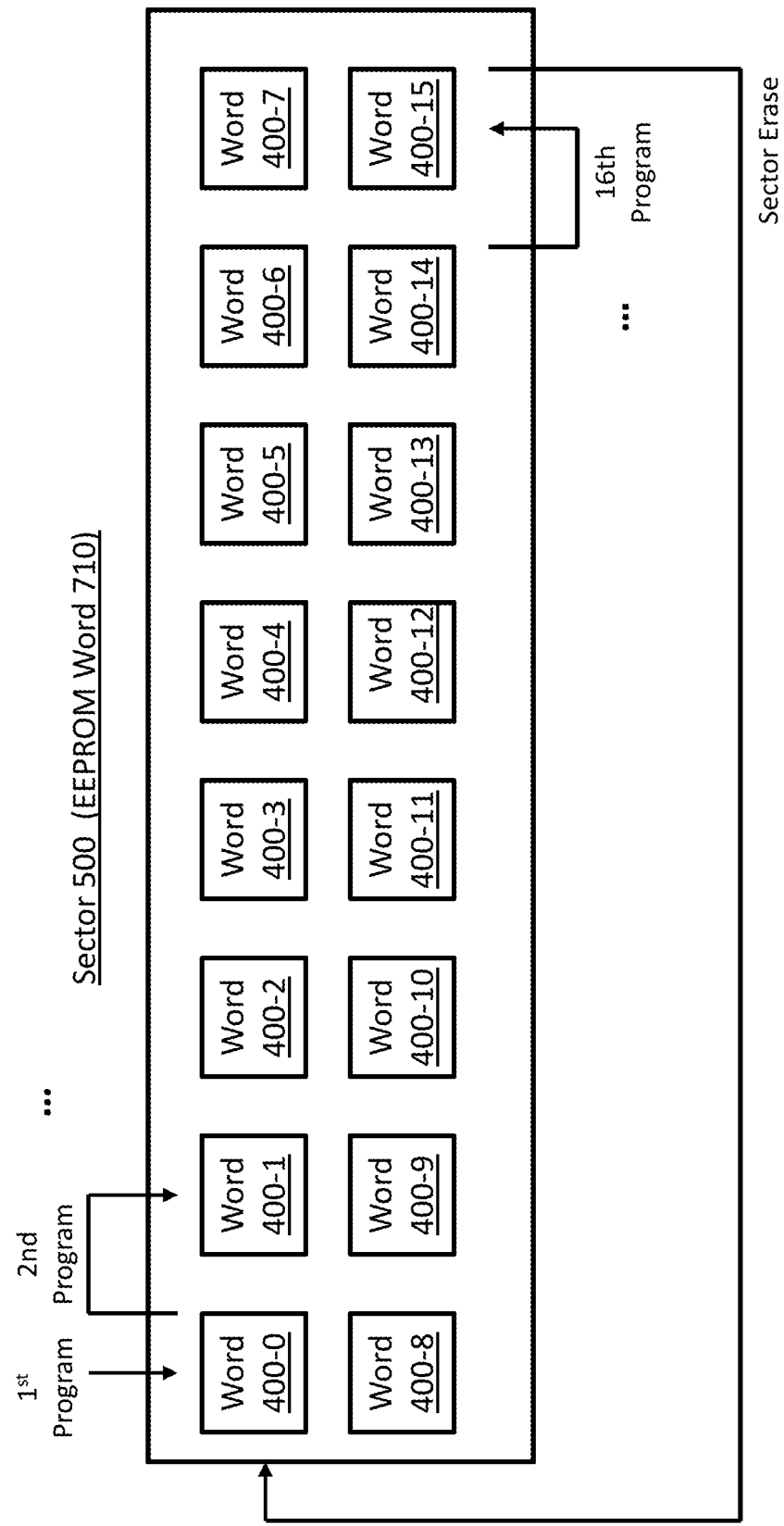
FIG. 7 depicts a prior art wear leveling method.
Figure 8:
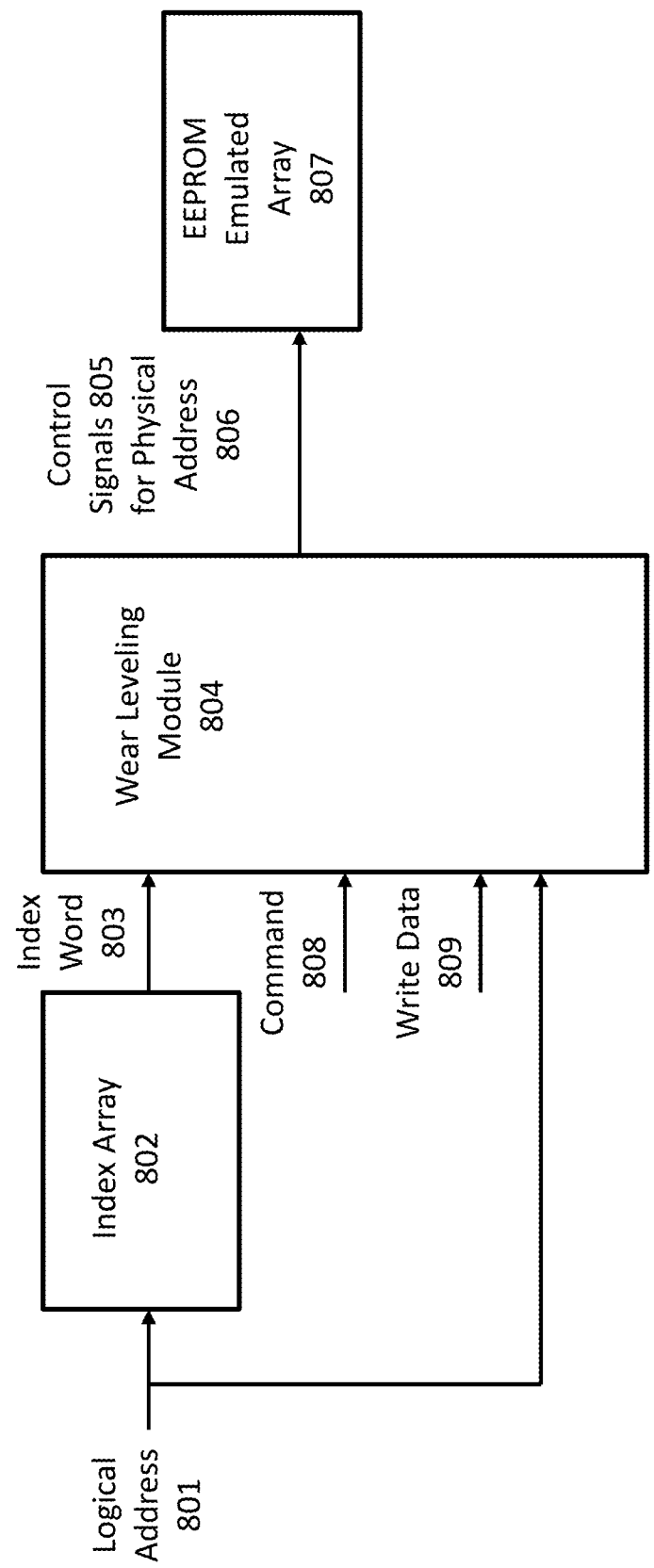
FIG. 8 depicts a wear leveling system.

FIG. 8 depicts improved EEPROM emulated system with wear leveling 800. System 800 comprises index array 802, wear leveling module 804, and EEPROM emulated array 807. Index array 802 receives logical address 801 and outputs index word 803. Wear leveling module 804 receives index word 803, logical address 801, command 808 (e.g., a program, erase, or read command), and write data 809 (e.g., the data to be written during a program operation) and outputs control signals 805 for physical address 806. Physical address 806 is a unique address for a physical location in the EEPROM emulated array 807, usually comprising a column number and row number. Control signals 805 assert the row and column for physical address 806, thereby enabling a read, erase, or programming operation to occur at physical address 806. Index array 802 contains a separate index word for each sector in EEPROM emulated array 807. Wear leveling module 804 be implemented using a processor or controller executing software instructions, combinatorial logic, or other known techniques.

Figure 9:
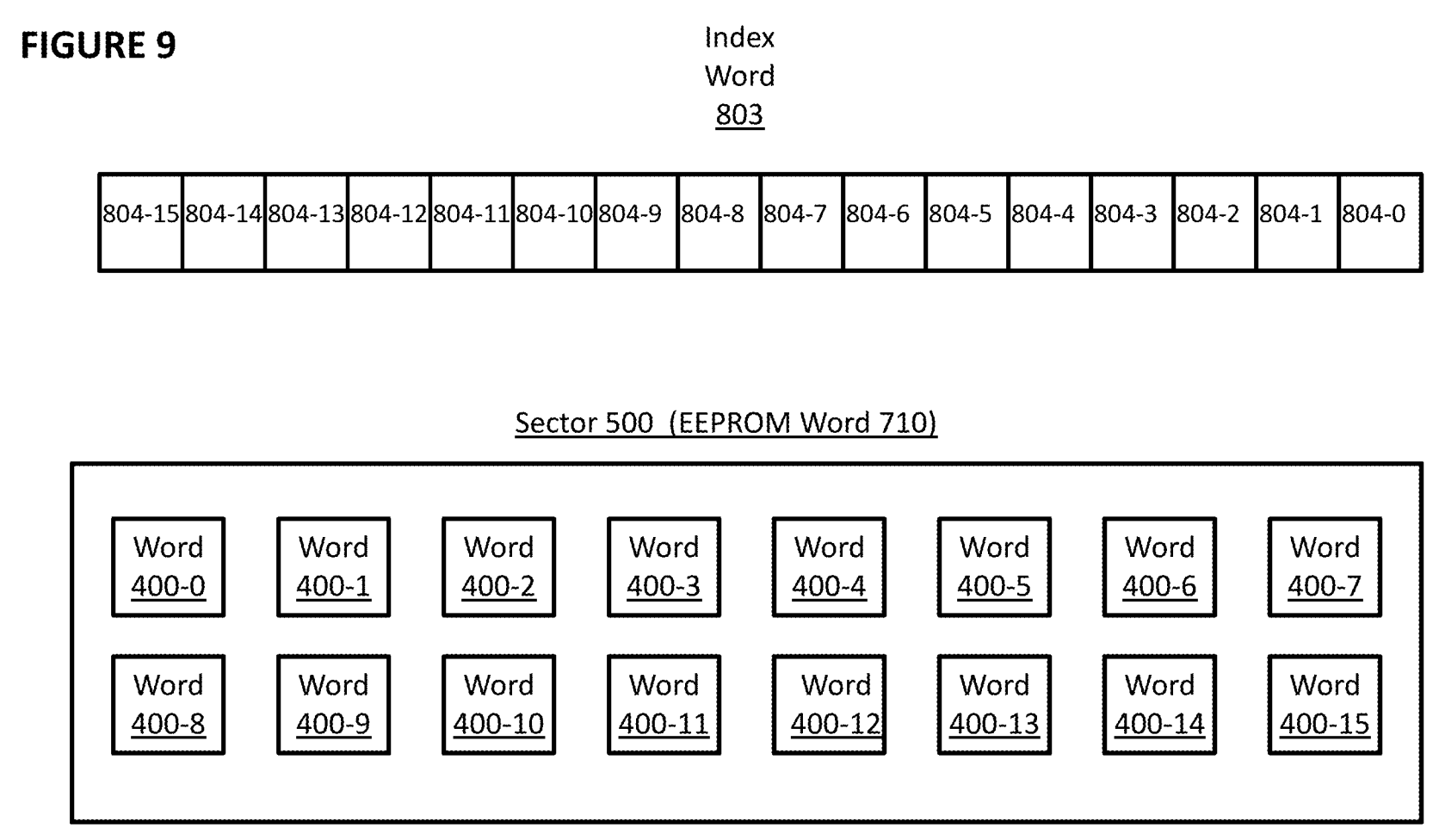

An example is shown in FIG. 9. Here, index word 803 corresponds to sector 500 in EEPROM emulated array 807. Index word 803 comprises 16 index bits, 804-0, 804-1, 804-15. Index bit 804-0 corresponds to physical word 400-0, index bit 804-1 corresponds to physical word 400-1, index bit 804-2 corresponds to physical word 400-2, index bit 804-3 corresponds to physical word 400-3, index bit 804-4 corresponds to physical word 400-4, index bit 804-5 corresponds to physical word 400-5, index bit 804-6 corresponds to physical word 400-6, index bit 804-7 corresponds to physical word 400-7, index bit 804-8 corresponds to physical word 400-8, index bit 804-9 corresponds to physical word 400-9, index bit 804-10 corresponds to physical word 400-10, index bit 804-11 corresponds to physical word 400-11, index bit 804-12 corresponds to physical word 400-12, index bit 804-13 corresponds to physical word 400-13, index bit 804-14 corresponds to physical word 400-14, and index bit 804-15 corresponds to physical word 400-15. Physical word 400-0 is the first physical word in sector 500, and physical word 400-15 is the last physical word in sector 500.

Figure 10:
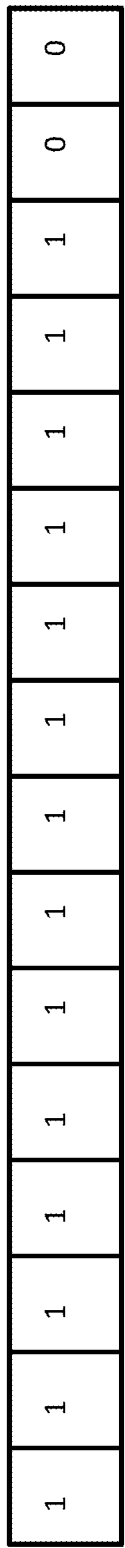
FIG. 10 depicts a populated, exemplary index word in the wear leveling system of FIG. 8.

With reference to FIG. 10, each particular index bit 804 in index word 803 is set to "1" if its corresponding physical word is not being used and to "0" if its corresponding physical word is being used or has been used. Here, bits 804-1 and 804-0 are set to "0" indicating that physical words 400-1 and 400-0 are being used or have been used, with bit 804-0 being the least significant bit. Under this system, the most significant bit containing a "0" corresponds to the current word that was programmed most recently, labeled current word 1010, which in this example is physical word 400-1. In this example, physical word 400-0 was previously used (at which point physical word 400-0 was the current word 1010) but is now holding "stale" data.

Figure 11:
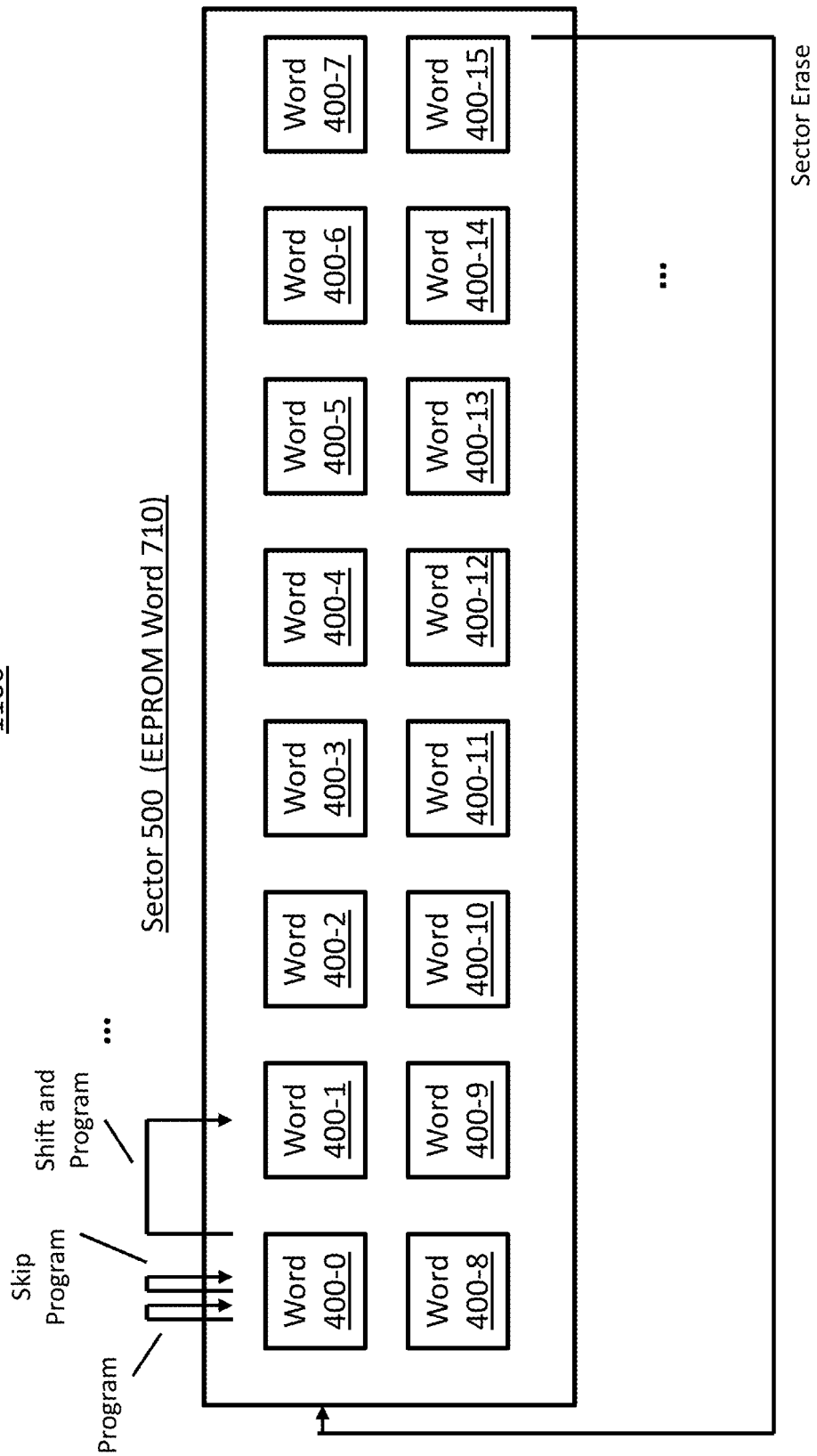
FIG. 11 depicts a wear leveling method.

FIG. 11 depicts wear leveling method 1100 that utilizes index array 802 and index words such as index word 803. The use of index array 802 and index words provides the system with greater capability than prior art wear leveling method 700, because the system no longer needs to automatically advance to the next word when a program operation occurs. Instead, as discussed in greater detail below with reference to FIGS. 12A, 12B. and 12C, in some instances the system will program certain bits in the current word or will skip programming certain bits in the current word if appropriate.

Figure 12C:
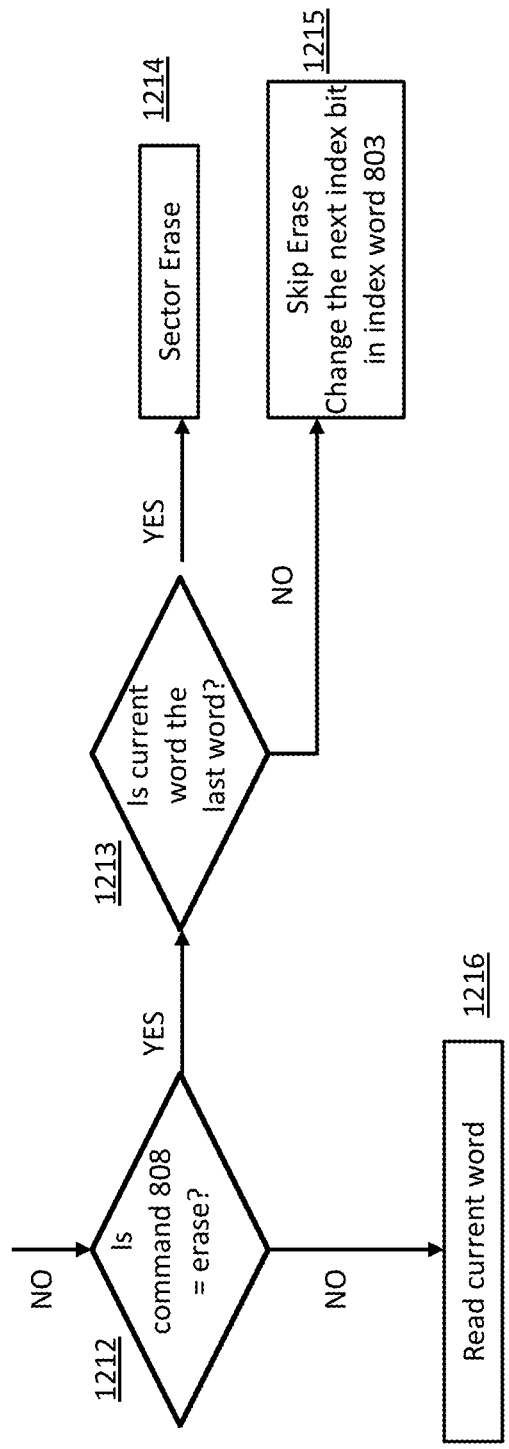

FIGS. 12A, 12B, and 12C depict additional detail regarding system 800 (shown previously in FIG. 8) and how it performs wear leveling method 1100 (shown previously in FIG. 11). Advantageously, the EEPROM emulator of the present embodiments performs wear leveling while still allowing for individual bit programming.

In step 1201, wear leveling module 804 receives command 808, logical address 801, index word 803, and write data 809 (when command 808 is a program command), and proceeds to step 1202.

In step 1202, wear leveling module 804 reads current word 1010 in EEPROM Emulated Array 807 using logical address 801 and index word 803, and proceeds to step 1203.

In step 1203, wear leveling module 804 determines if command 808 is a program command. If yes, it proceeds to step 1204. If no, it proceeds to step 1212.

In step 1204, wear leveling module 804 generates mask 1220 based on current word 1010 and write data 809, and proceeds to step 1205. Mask 1220 is generated according to Table 8:

TABLE 8

| Bit Value in Current Word 1010 | Bit Value in Write Data 809 | Bit Value in Mask 1220 | Explanation |
| --- | --- | --- | --- |
| 0 | 0 | 1 | A bit value of "1" in mask 1220 means that the bit will be masked and not programmed. Here, this bit is masked because the bit value in current word 1010 is already a "0" and does not need to be programmed again. Programming that bit again may result in program disturbance for adjoining cells. This is an improvement over prior art wear leveling method 700. |
| 0 | 1 | 1 | This bit is masked because a program operation cannot change a "0" to a "1." |
| 1 | 0 | 0 | This bit is not masked, because a program operation can change a "1" to a "0." |
| 1 | 1 | 1 | This bit is masked. No change is required to the bit. |

In step 1205, wear leveling module 1205 determines if mask 1220 contains at least one "0" (un-masked) bit. If yes, it proceeds to step 1207. If no, it proceeds to step 1206.

In step 1206, wear leveling module 804 skips the program operation. It does so because it has concluded that data 809 cannot be stored through a program operation because data 809 does not contain any "0" that corresponds to a "1" stored in the current word 1010. Because a program operation can only change a "1" to a "0" (and not a "0" to a "1") there is nothing to be accomplished through the program operation. It is possible that write data 809 will contain a "1" that corresponds to a "0" stored in the current word and that there will be a mismatch between the data that is intended to be stored (write data 809) and the data that is actually stored (current word 1010). The external system optionally can perform a read-verify operation to ensure that EEPROM word 710 is correctly storing the data that is intended to be stored (write data 809). When the verify operation fails, the external system then can perform an erase operation and then program write data 809 again. As indicated in Table 8, advantageously, a bit is not programmed twice, which prevents program disturbance for adjoining cells, and increasing endurance.

In step 1207, wear leveling module 804 determines if current word 1010 is the last physical word in sector 500. If yes, it proceeds to step 1208. If no, it proceedings to step 1209.

In step 1208, wear leveling module 804 programs data 809 in the current word 1010 by asserting control signals 805 for physical address 806 (which here is the physical address associated with the current word) and programming data 809 into physical address 806 within EEPROM emulated array 807 for those bits that are unmasked according to mask 1220. It is possible that write data 809 will contain a "1" that corresponds to a "0" stored in current word 1010 and that there will be a mismatch between the data that is intended to be stored (write data 809) and the data that is actually stored (current word 1010). The external system optionally can perform a read-verify operation to ensure that EEPROM word 710 is correctly storing the data that is intended to be stored (write data 809). When the verify operation fails, the external system then can perform an erase operation and then program write data 809 again. Notably, because it is possible that the last physical word has been programmed previously since the last erase operation, the possibility of a program disturbance increases. However, this is an acceptable consequence, because the previous word already contains "stale data," and if its data is disturbed it will not affect the integrity of the system. Also, there is no subsequent physical word next to the last physical word, so there is no concern of a program disturbance occurring on that side of the last physical word.

In step 1209, wear leveling module 1209 determines if current word 1010 contains all "1"s. If yes, it proceeds to step 1210. If no, it proceeds to step 1211.

In step 1210, wear leveling module 1209 programs data 809 into the current word 1010. No mismatch will occur, because current word 1010 was in an erased state (all "1"s) prior to the programming operation. Moreover, there is no concern with a program disturbance occurring since the current word 1010 has not been programmed since it was last erased. Wear leveling module 1209 programs data into the current word 1010 by asserting control signals 805 for physical address 806 (which here is the physical address associated with current word 1010) and programming data 809 into physical address 806 within EEPROM emulated array 807 for those bits that are unmasked according to mask 1220.

In step 1211, wear leveling module 1211 programs data 809 in next word and shifts to the next word in index word 803. It does this because current word 1010 was determined to not be an an erased state (all "1"s) in step 1209, which means that current word 1010 had already been programmed. The shift is implemented to avoid any possibility of program disturbance occurring. Wear leveling module 1211 programs data into the next word by asserting control signals 805 for physical address 806 (which here is the physical address associated with the next word) and programming data 809 into physical address 806 within EEPROM emulated array 807. It shifts to the next bit in index word 803 by changing the index bit for the next word from "1" to "0" (which itself requires a program operation to index word 803).

In step 1212, wear leveling module 804 determines if command 808 is an erase command. If yes, it proceeds to step 1213. If no, it proceeds to step 1216.

In step 1213, wear leveling module 804 determines if the current word is the last physical word in sector 500 (meaning that the current word is word 400-15, which will be indicated by index bit 804-15 being "0"). If yes, it proceeds to step 1214. If no, it proceeds to step 1215.

In step 1214, wear leveling module 804 performs a sector erase on sector 500, which will cause all bits in words 400-0, 400-1, 400-15 to be changed to a "1," and which also will erase index word 803, such that all bits in index word 803 will be changed to a "1".

In step 1215, wear leveling module 804 skips the erase operation and instead shifts to the next bit in index word 803 by changing the index bit for the next physical word from "1" to "0" (which itself requires a program operation to index word 803). This is effectively the same as an erase since it advances to the next word, which has not yet been programmed and contains all "1"s.

In step 1216, wear leveling module 804 performs a read operation, since it can deduce that command 808 is a read command. It performs the read by asserting control signals 805 for physical address 806 (which here is the physical address associated with current word 1010) and reading data from physical address 806 in EEPROM emulated array 807.

The embodiments described herein have the following advantages over prior art wear leveling method 700:

In the embodiments, each particular bit will not be programmed to a "0" value more than once between erase operations on that bit, which reduces the program disturb phenomena;

The embodiments perform wear leveling while allowing bit programming, whereas only word-level programming is allowed for in prior art wear leveling method 700; and When the embodiments receive a sector erase command, they will shift to the next word without performing an erase until the point where the current word is the last word in the sector.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An EEPROM emulated system with wear leveling, comprising:
an EEPROM emulated array comprising an array of non-volatile memory cells; and
a wear leveling module coupled to the array of non-volatile memory cells and configured to:
receive a program command, write data, and a logical address;
read a current word within a sector of physical words of non-volatile memory cells in the array of non-volatile memory cells based on the logical address and an index bit, the sector of words corresponding to the logical address and comprising a first physical word, a last physical word, and one or more physical words between the first physical word and the last physical word;
when the write data does not contain a "0" for a bit that is a "1" in the current word, skipping the programming operation;
when the write data does contain a "0" for a bit that is a "1" in the current word, and the current word is the last physical word in the sector, programming the write data in the current word; and
when the write data does contain a "0" for a bit that is a "1" in the current word, and the current word is not the last physical word in the sector, programming the write data in the next word.

2. The system of claim 1, wherein the index bit is a bit in an index word.

3. The system of claim 2, wherein the index word comprises a set of bits, wherein each bit in the index word corresponds to a physical word in the array.

4. The system of claim 3, wherein each bit in the index word indicates whether a corresponding physical word in the array is used or not used.

5. The system of claim 1, wherein the sector comprises two rows of non-volatile memory cells in the array of non-volatile memory cells.

6. The system of claim 1, wherein each of the non-volatile memory cells comprises a bit line terminal, a source line terminal, a word line terminal, and a floating gate.

7. The system of claim 6, wherein each of the non-volatile memory cells further comprises a control gate.

8. The system of claim 7, wherein each of the non-volatile memory cells further comprises an erase gate.

* * * * *